(12) United States Patent
Gatineau et al.

(10) Patent No.: US 9,240,319 B2
(45) Date of Patent: Jan. 19, 2016

(54) CHALCOGENIDE-CONTAINING PRECURSORS, METHODS OF MAKING, AND METHODS OF USING THE SAME FOR THIN FILM DEPOSITION

(75) Inventors: Julien Gatineau, Tsuchiura (JP); Mao Minoura, Kanagawa (JP); Hana Ishii, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 718 days.

(21) Appl. No.: 13/576,988

(22) PCT Filed: Dec. 29, 2010

(86) PCT No.: PCT/IB2010/056118
§ 371 (c)(1),
(2), (4) Date: Jun. 25, 2013

(87) PCT Pub. No.: WO2011/095849
PCT Pub. Date: Aug. 11, 2011

(65) Prior Publication Data
US 2013/0267082 A1  Oct. 10, 2013

Related U.S. Application Data

(60) Provisional application No. 61/301,147, filed on Feb. 3, 2010, provisional application No. 61/311,172, filed on Mar. 5, 2010.

(51) Int. Cl.
*H01L 21/02* (2006.01)
*C23C 16/18* (2006.01)
(Continued)

(52) U.S. Cl.
CPC .......... *H01L 21/02568* (2013.01); *C23C 16/18* (2013.01); *C23C 16/30* (2013.01); *C23C 16/305* (2013.01); *C23C 16/45553* (2013.01)

(58) Field of Classification Search
CPC .. H01L 21/02568; C23C 16/18; C23C 16/30; C23C 16/305; C23C 16/45553
See application file for complete search history.

(56) References Cited

U.S. PATENT DOCUMENTS 3,573,958 A    4/1971  Small
4,141,778 A    2/1979  Domrachev et al.
(Continued)

FOREIGN PATENT DOCUMENTS

DE    42 34 998    4/1994
EP    0 568 074    11/1993
(Continued)

OTHER PUBLICATIONS

Sadekov, "Synthesis and reactions of organic compounds containing bonds of Te to Group 14 elements", Russian Chemical Reviews, vol. 71 (2), pp. 99-110 (2002).*

(Continued)

*Primary Examiner* — Marvin Payen
*Assistant Examiner* — Victor Barzykin
(74) *Attorney, Agent, or Firm* — Patricia E. McQueeney

(57) ABSTRACT

Disclosed are chalcogenide-containing precursors for use in the manufacture of semiconductor, photovoltaic, LCD-TFT1 or flat panel type devices. Also disclosed are methods of synthesizing the chalcogenide-containing precursors and vapor deposition methods, preferably thermal ALD, using the chalcogenide-containing precursors to form chalcogenide-containing films.

12 Claims, 3 Drawing Sheets

Structures of (a) $Me_2Ge(TeMe)_2$, (b) $Me_2Ge(TetBu)_2$, (c) $Me_2Ge(TeSiMe_3)_2$, (d) $Me_2Si(TeMe)_2$, (e) $Me_2Si(TetBu)_2$, (f) $Me_2Si(TeSiMe_3)_2$, (g) $MeGe(TeMe)_3$, (h) $(SiMe_3)Ge(TeMe)_3$, (i) $(GeMe_3)Ge(TeMe)_3$, (j) $(SiMe_3)Ge(TeSiMe_3)_3$, (k) $MeSi(TeMe)_3$, (l) $(SiMe_3)Si(TeMe)_3$, and (m) $(GeMe_3)Si(TeSiMe_3)_3$

(51) Int. Cl.
*C23C 16/30* (2006.01)
*C23C 16/455* (2006.01)

(56) References Cited

U.S. PATENT DOCUMENTS

| | | | |
|---|---|---|---|
| 4,377,613 | A | 3/1983 | Gordon |
| 4,419,386 | A | 12/1983 | Gordon |
| 5,656,338 | A | 8/1997 | Gordon |
| 6,005,127 | A | 12/1999 | Todd et al. |
| 6,984,591 | B1 | 1/2006 | Buchanan et al. |
| 7,413,776 | B2 | 8/2008 | Shenai-Khatkhate et al. |
| 7,838,329 | B2 | 11/2010 | Hunks et al. |
| 7,943,502 | B2 | 5/2011 | Park et al. |
| 2006/0035462 | A1 | 2/2006 | Millward |
| 2006/0046521 | A1 | 3/2006 | Vaartstra et al. |
| 2006/0063394 | A1 | 3/2006 | McSwiney et al. |
| 2006/0138393 | A1 | 6/2006 | Seo et al. |
| 2006/0172067 | A1 | 8/2006 | Ovshinsky et al. |
| 2006/0172068 | A1 | 8/2006 | Ovshinsky |
| 2006/0180811 | A1 | 8/2006 | Lee et al. |
| 2006/0292301 | A1 | 12/2006 | Herner |
| 2007/0042224 | A1 | 2/2007 | Reuter et al. |
| 2007/0054475 | A1 | 3/2007 | Lee et al. |
| 2008/0003359 | A1 | 1/2008 | Gordon et al. |
| 2008/0026577 | A1 | 1/2008 | Shenai-Khatkhate et al. |
| 2008/0035906 | A1 | 2/2008 | Park et al. |
| 2008/0096386 | A1 | 4/2008 | Park et al. |
| 2008/0108174 | A1 | 5/2008 | Park et al. |
| 2008/0108175 | A1 | 5/2008 | Shin et al. |
| 2008/0279386 | A1 | 11/2008 | Kahn |
| 2009/0072285 | A1 | 3/2009 | Hwang |
| 2009/0112009 | A1 | 4/2009 | Chen et al. |
| 2009/0124039 | A1* | 5/2009 | Roeder et al. .......... 438/99 |
| 2009/0137100 | A1 | 5/2009 | Xiao et al. |
| 2009/0142881 | A1 | 6/2009 | Xiao et al. |
| 2009/0162973 | A1 | 6/2009 | Gatineau et al. |
| 2009/0280052 | A1 | 11/2009 | Xiao et al. |
| 2009/0299084 | A1 | 12/2009 | Okubo et al. |
| 2009/0305458 | A1 | 12/2009 | Hunks et al. |
| 2009/0321733 | A1 | 12/2009 | Gatineau et al. |
| 2010/0009078 | A1 | 1/2010 | Pore et al. |
| 2011/0262660 | A1 | 10/2011 | Ishii et al. |

FOREIGN PATENT DOCUMENTS

| | | |
|---|---|---|
| EP | 1 180 553 | 2/2002 |
| EP | 1 464 724 | 10/2004 |
| EP | 1 464 725 | 10/2004 |
| EP | 1 806 427 | 7/2007 |
| EP | 1 995 236 | 11/2008 |
| EP | 2 130 942 | 12/2009 |
| JP | H06 166691 | 6/1994 |
| WO | WO 83 01018 | 3/1983 |
| WO | WO 96 40448 | 12/1996 |
| WO | WO 98 16667 | 4/1998 |
| WO | WO 00 23635 | 4/2000 |
| WO | WO 00 29637 | 5/2000 |
| WO | WO 01 66816 | 9/2001 |
| WO | WO 02 27063 | 4/2002 |
| WO | WO 03 083167 | 10/2003 |
| WO | WO 2007 062096 | 5/2007 |
| WO | WO 2007 067604 | 6/2007 |
| WO | WO 2007 133837 | 11/2007 |
| WO | WO 2008 002546 | 1/2008 |
| WO | WO 2008 008319 | 1/2008 |
| WO | WO 2008 057616 | 5/2008 |
| WO | WO 2009 039187 | 3/2009 |
| WO | WO 2009 081383 | 7/2009 |
| WO | WO 2009 132207 | 10/2009 |
| WO | WO 2010 055423 | 5/2010 |
| WO | WO 2011 027321 | 3/2011 |

OTHER PUBLICATIONS

Akkari, A. et al., "Three coordinate divalent Group 14 element compounds with a β-diketiminate as supporting ligand $L^2MX$ [$L^2$=PhNC(Me)CHC(Me)NPh, X=Cl, I; M=Ge, Sn]", Journal of Organometallic Chemistry 622 (2001) pp. 190-198.

Ayers, A.E. et al., "Azido derivatives of Germanium(II) and Tin(II): Syntheses and characterization of [(Mes)$^2$DAP]GeN$^3$, [(Mes)$_2$DAP]SnN$_3$, and the corresponding chloro analogues featuring heterocyclic six-π-electron ring systems (where [(Mes)$_2$DAP]=N(Mes)C(Me)}$_2$CH)," Inorg. Chem. 2001, 40, pp. 1000-1005.

Becker, G. et al., "Synthese, Struktur and Reaktivität des Lithium-[tris-trimethylsilyl]silyl]tellanids," Anorg. Allg. Chem., 1992, 613, pp. 7-18.

Bonasia, P.J. et al. "New reagents for the synthesis of compounds containing metal-tellurium bonds: sterically hindered silyltellurolate derivatives and the x-ray crystal structures of [(THF)2LiTeSi(SiMe3)3]2 and [(12-crown-4)2Li][TeSi(SiMe3)3]", J. Am. Chem. Soc., 1992, 114 (13), pp. 5209-5214.

Bonasia, P.J. et al., "Synthesis and characterization of gold(I) thiolates, selenolates, and tellurolates—x-ray crystal structures of Au$_4$[TeC(SiMe$_3$)$_3$]$_4$, Au$_4$[SC(SiMe$_3$)$_3$]$_4$, and Ph$_3$PAu[TeC(SiMe$_3$)$_3$]," Inorganic Chemistry, 1993, 32, pp. 5126-5131.

Breunig, H.J. "Thermochromic molecules with bonds of Se or Te and Sb or Bi", Phosphorus and Sulfur, 1988, vol. 38, pp. 97-102.

Chizmeshya, A.V.G. et al., "Synthesis of butane-like SiGe hydrides: Enabling precursors for CVD of Ge-rich semiconductors," J. Am. Chem. Soc. 2006, 128, pp. 6919-6930.

Choi B. J. et al. "Cyclic PECVD of Ge$_2$Sb$_2$Te$_5$ films using metal-lorganic sources." J. Electrochem. Soc., (2007) 154 (4), pp. H318-H324.

Choi, B.J. et al. "Plasma-enhanced atomic layer deposition of Ge$_2$Sb$_2$Te$_5$ films using metal-organic sources for Phase change RAM." ALD 2006 proceedings, p. 62.

Dabbousi, B.O. et al., "(Me$_3$Si)$_3$SiTeH: preparation, characterization, and synthetic utility of a remarkably stable tellurol," J. Am. Chem. Soc., 1991, 113, pp. 3186-3188.

Detty, M.R. et al., "Bis(trialkylsily1) chalcogenides. 1. Preparation and reduction of group 6A oxides," J. Org. Chem., 1982, 47, pp. 1354-1356.

Ding, Y. et al., "Synthesis and structures of monomeric divalent germanium and tin compounds containing a bulky diketiminato ligand," Organometallics 2001, 20, pp. 1190-1194.

Drake, J.E. et al. "Studies of silyl and germyl group 6 species. 5. Silyl and germyl derivatives of methane- and benzenetellurols," Inorg. Chem. 1980, 19, pp. 1879-1883.

Du Mont, W.W. et al., "α-Eliminierungsreaktionen an Trihalogengermylphosphinen," Journal of organometallic Chemistry, 128 (1977), p. 99-114.

Du Mont, W.W. et al., "Triorganophosphan-dichlor- und -dibroringermandiyl und -stannandiyl: Phosphan-stabilisierte Ge$^{II}$- und Sn$^{II}$-Halogenide," Angew. Chem. 88 Jan. 1976, Nr. 9, p. 303.

Eom, T. et al., "Atomic Layer Deposition of (GeTe2)x(Sb2Te3)y films for phase change memories," Proceedings of Seoul National University Conference, Feb. 16-18, 2011.

Glatz, F. et al. "Thermal CVD of amorphous germanium films from 2,5-bis(tert.-butyl)-2,5-diaza-1-germa-cyclopentane organometallic precursor." Mat. Res. Soc. Symp. Proc.,1994, vol. 336, pp. 541-545.

Gonzalez-Hernandez, et al. "Structure of oxygen-doped Ge:Sb:Te films." Thin Solid Films (2006), 503(1-2), pp. 13-17.

Groshens, T.J. et al., "Low temperature MOCVD growth of V/VI materials via a Me$_3$SiNMe$_2$ elimination reaction." Thermoelectrics, 1996. Fifteen International Conference on Pasadena, CA, USA Mar. 26-29, 1996, New York, Mar. 26, 1996, pp. 430-434.

Gu et al. "Optical and structural properties of oxygen-doped and annealed Ge—Sb—Te-thin films." Chinese Journal of Lasers (2003), 30(12), pp. 1110-1115.

(56) References Cited

OTHER PUBLICATIONS

Herrmann, W.A. et al. "Stable cyclic germanediyls ("cyclogermylenes"); Synthesis, structure, metal complexes, and thermolyses." Angew. Chem. Int. Ed. Engl., (1992) 31, No. 11, pp. 1485-1488.
Jutzi, P. et al., "Base stabilized germylene. II. Preparation and properties of benzothiazole dichlorogermylene," Journal of Organometallic Chemistry, 1974, vol. 81, No. 3, pp. 341-350.
Jutzi, P. et al., "On the reactivity of the silicon—carbon bond in pyridylsilanes," Journal of Organometallic Chemistry, 1976, vol. 104, No. 2, p. 153-160.
Jutzi, P. et al., "Stabilization of Monomeric Dichlorogermylene," Angew. Chem. Internat. Edit. vol. 12 (1973), No. 12, pp. 1002-1003.
Kim, YK et al. "Phase separation of a $Ge_2Sb_2Te_5$ alloy in the transition from an amorphous structure to crystalline structures." J. Vac. Sci. Technol. 929, 24(4), 2006.
Kim, R-Y et al. "Structural properties of $Ge_2Sb_2TE_5$ thin films by metal organic chemical vapor deposition for phase change memory applications," Appl. Phys. Lett., 89, 2006, pp. 102107-1-102107-3.
King, R.B. "Secondary and tertiary phosphine adducts of germanium(II) iodide", Inorganic Chemistry, vol. 2, No. 1, Feb. 1963.
Kouvetakis, J. et al., "Synthesis and atomic and electronic structure of new Si—Ge—C alloys and compounds," Chem. Matter. 1998, 10, pp. 2935-2949.
Lappert, M.F. et al. "Monomeric, coloured germanium(II) and tin(II) di-t-butylamides, and the crystal and molecular structure of $Ge(NCMe_2[CH_2]_3CMe_2)_2$". J. Chemical Soc. Chem. Comm. 1980, pp. 621-622.
Lee, J. et al. "GeSbTe deposition for the PRAM application". Appl. Surf. Sci. (2007) 253, pp. 3969-3976.
Lee, V.Y. et al., "Redox properties of dihalogermylenes, dihalostannylenes and their complexes with Lewis bases," Journal of Organometallic Chemistry, 499 (1995), pp. 27-34.
Mironov, V.B. et al., "New method for preparing germanium dichloride and its use in syntheses of organogermanium compounds," Russian Journal of General Chemistry, vol. 64, No. 8, Part 1, 1994, p. 1180.
Mironov, V.B. et al., "New routes to germanium dihalide dioxanates," Russian Journal of General Chemistry, vol. 64, No. 4, Part 2, 1994, p. 633.
Nagendran, S. et al., "RGe(I)Ge(I)R compound (R=PhC(NtBu)$_2$ with a Ge-Ge single bond and a comparison with the gauche conformation of hydrazine," Organometallics 2008, 27, p. 5459-5463.
Naghavi, N. et al., "Growth studies and characterisation of In2S3 thin films deposited by atomic layer deposition (ALD)," Applied Surface Science 222 (2004), pp. 65-73.
Nefedov, O.M. et al., "Inorganic, organometallic, and organic analogues of carbenes," Angew. Chem. Internat. Edit., vol. 5 (1966), No. 12, pp. 1021-1038.
Nefedov, O.M. et al., "Molecular complexes of germylene with n-donor ligands", Proceedings of the Academy of Sciences of the USSR Series Chemical, 1980, pp. 170-173, 1980.
Nefedov, O.M. et al., "New adducted complexes of dichlorogermanium", Proceedings of the Academy of Sciences of the USSR Series Chemical, 1973, No. 12, pp. 2824-2825.
N-Methyl Morpholine product specification, downloaded from http://chemicalland21.com/industrialchem/functional%20Monomer/N-METHYL%20MORPHOLINE.htm Sep. 1, 2010.
Pacl, Z. et al., "Organogermainum compounds. X. The effect of structure on the basicity of ethyl(dimethylamino)germanes," Collection Czechoslov, Chem. Commun. vol. 36, 1971, pp. 2181-2188.
Pore, V. et al. "Atomic layer deposition of metal tellurides and selenides using alkylsilyl compounds of tellurium and selenium," J. Am. Chem. Soc., DOI 10.1021/ja8090388.
Prokop, J. et al. "Selective deposition of amorphous germanium on Si with respect to $SiO_2$ by organometallic CVD." J. NonCryst. Solids, 198-200 (1996), pp. 1026-1028.
Razuvaev et al., "Complex compound of dichloride germanium," Proceedings of the Academy of Sciences of the USSR Series Chemical, 1966, No. 3, pp. 584-585.
Razuvaev, G.A. et al. "Organosilicon and organogermanium derivatives with silicon-metal and germanium-metal bonds," 1969, vol. 19, Issue 3, pp. 353-374; can be found at http://media.iupac.org/publications/pac/1969/pdf/1903x0353.pdf.
Ritala, M. et al., "Atomic layer deposition of Ge2Sb2Te$_5$ thin films," Microelectronic Engineering, Oct. 2009, vol. 86, No. 7-9, pp. 1946-1949.
Riviere, P. et al., "Germanium(II) and germanium(IV) compounds form elemental germanium," Organometallics 1991, 10, pp. 1227-1228.
Shcherbinin, V.V. et al. "Methods for preparing germanium dihalides," Russian J. of General Chem., vol. 68, No. 7, 1998, pp. 1013-1016.
Wang, et al. "Influence of Sn doping upon the phase change characteristics of $Ge_2Sb_2Te_5$." Phys. Stat. Sol. (A) 2004, 201(4), pp. 3087-3095.
Woelk, E. et al., "Designing novel organogermanium OMVPE precursors for high[purity germanium films," Journal of Crystal Growth 287 (2006), pp. 684-687.
International Search Report and Written Opinion for related PCT/IB2009/008067, Jun. 1, 2010.
International Search Report and Written Opinion for corresponding PCT/IB2010/056118, May 24, 2011.
Air Liquide, "Development of new alkylgermyl telluride molecules and their use for room temperature GST depositions," Poster, ECS 2011—220th ECS Meeting and Electrochemical Energy Summit, Boston, Massachusetts, Oct. 9-14, 2011, 1 pg.
Bruder, H., "3. Diazadien-Metall(O)-Komplexe" from dissertation titled "Das Diazadien-Eisen-System: Komplextypen, Reaktionen und katalytische anwendung," Frankfurt Univ., Frankfurt, Germany 1977, 133-216 and English translation.
Fowles, G.W.A. et al., "Some complexes of germanium(II) and tin(II) halides with nitrogen-donor ligands," Journal of the Less-Common Metals, 15 (1968) 209-217.
Kinzel, A., "4. Diazadien-metall(O)-Komplexe" from dissertation titled "Synthese Einiger Diazedien-Elementverbindungen ihre Reaktivität und Katalytische Wirksamkeit," Hamburg Univ., Hamburg, Germany 1979, 46-93 and English translation.
Mutoh, Y. et al., "Telluration of seleno- and chloroiminium salts leading to various telluroamides, and their structure and NMR properties," Journal of Organometallic Chemistry 692 (2007) 129-135.
Segi, M. et al., "Telluroaldehydes and telluroketones," J. Am. Chem. Soc. 1989, 111, 8749-8751.
Singapore Written Opinion for related SG 201008444-0, Jul. 1, 2011.
International Search Report and Written Opinion for related PCT/IB2010/053961, Nov. 9, 2010.

* cited by examiner

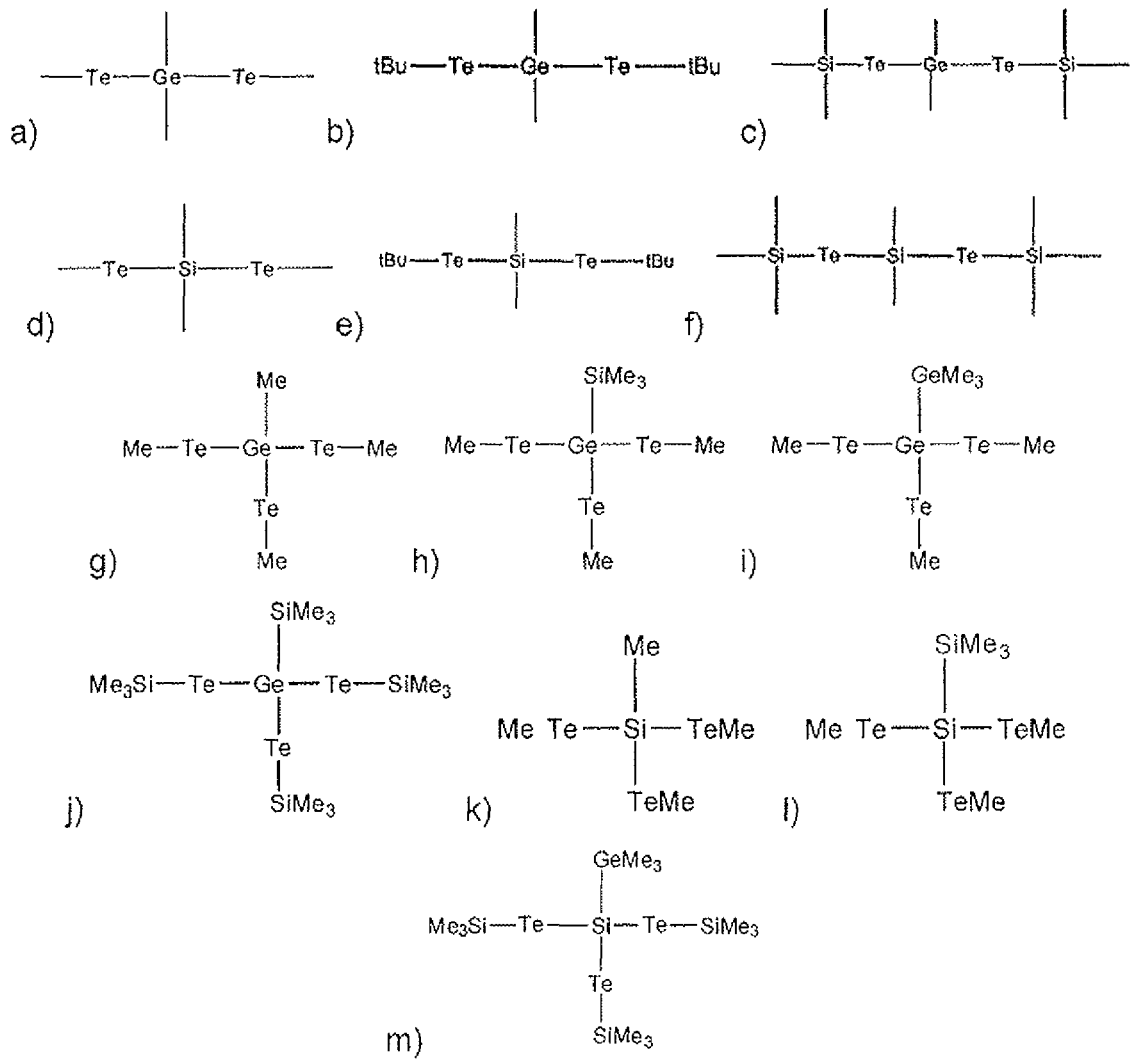
Figure 1. Structures of (a) Me$_2$Ge(TeMe)$_2$, (b) Me$_2$Ge(TetBu)$_2$, (c) Me$_2$Ge(TeSiMe$_3$)$_2$, (d) Me$_2$Si(TeMe)$_2$, (e) Me$_2$Si(TetBu)$_2$, (f) Me$_2$Si(TeSiMe$_3$)$_2$, (g) MeGe(TeMe)$_3$, (h) (SiMe$_3$)Ge(TeMe)$_3$, (i) (GeMe$_3$)Ge(TeMe)$_3$, (j) (SiMe$_3$)Ge(TeSiMe$_3$)$_3$, (k) MeSi(TeMe)$_3$, (l) (SiMe$_3$)Si(TeMe)$_3$, and (m) (GeMe$_3$)Si(TeSiMe$_3$)$_3$

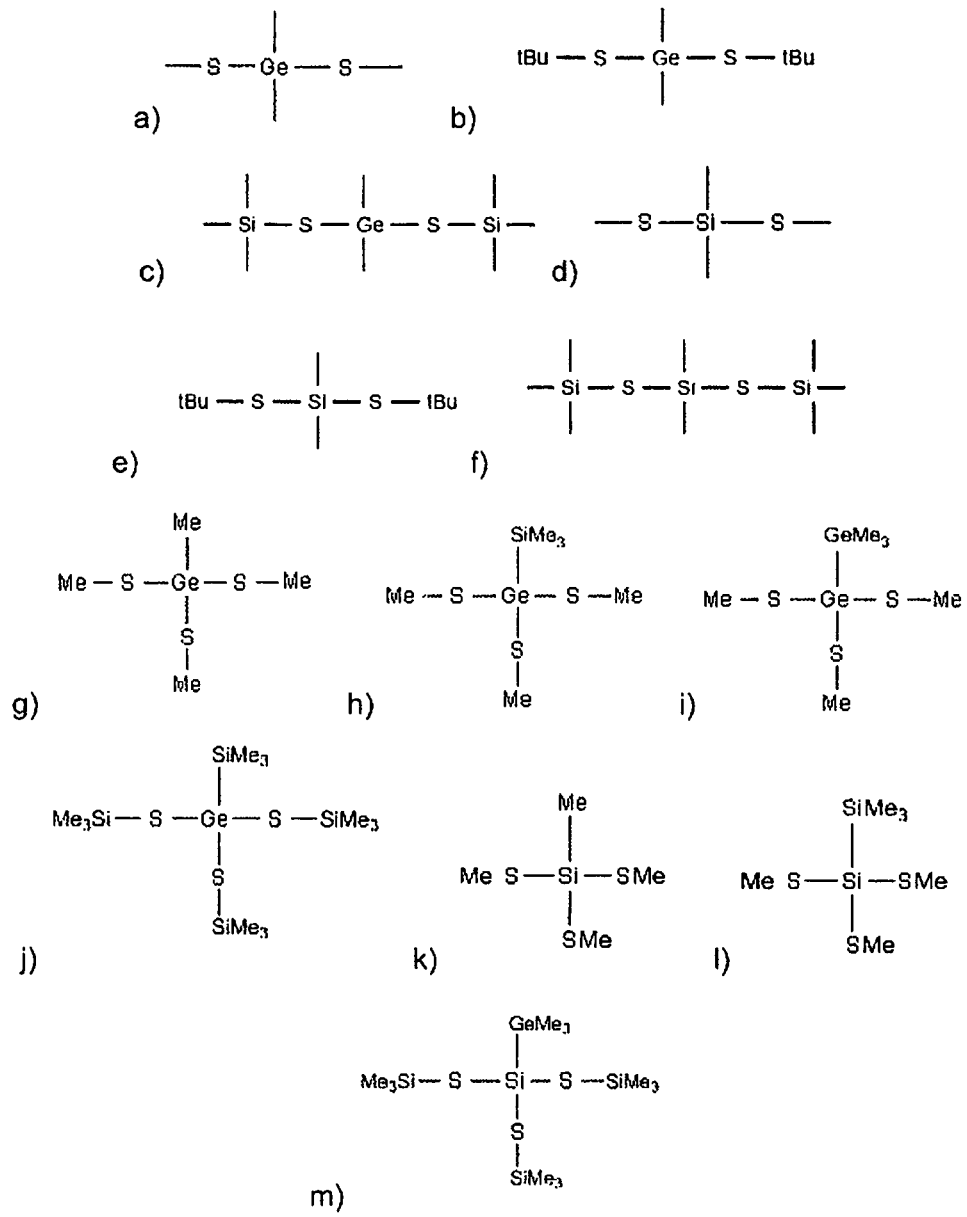
Figure 2. Structures of (a) Me$_2$Ge(SMe)$_2$, (b) Me$_2$Ge(StBu)$_2$, (c) Me$_2$Ge(SSiMe$_3$)$_2$, (d) Me$_2$Si(SMe)$_2$, (e) Me$_2$Si(StBu)$_2$, (f) Me$_2$Si(SSiMe$_3$)$_2$, (g) MeGe(SMe)$_3$, (h) (SiMe$_3$)Ge(SMe)$_3$, (i) (GeMe$_3$)Ge(SMe)$_3$, (j) (SiMe$_3$)Ge(SSiMe$_3$)$_3$, (k) MeSi(SMe)$_3$, (l) (SiMe$_3$)Si(SMe)$_3$, and (m) (GeMe$_3$)Si(SSiMe$_3$)$_3$

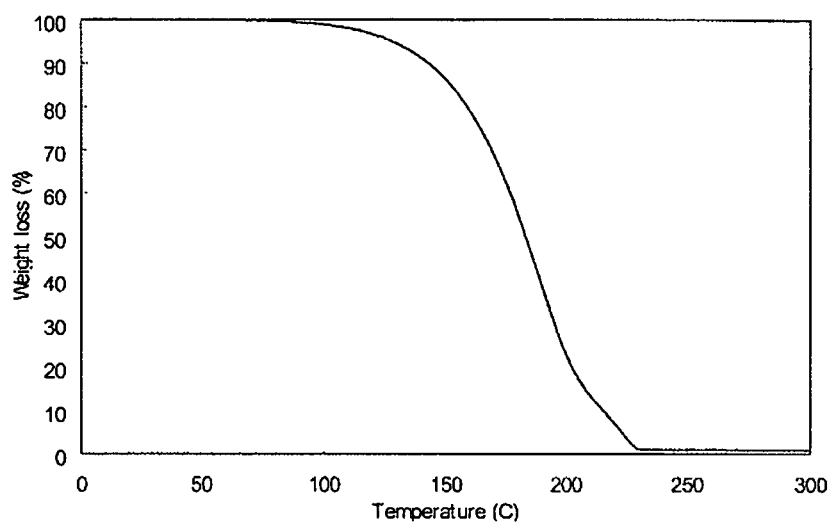
Figure 3. TGA of (MeTe)$_2$GeMe$_2$

CHALCOGENIDE-CONTAINING PRECURSORS, METHODS OF MAKING, AND METHODS OF USING THE SAME FOR THIN FILM DEPOSITION

CROSS REFERENCE TO RELATED APPLICATIONS

The present application is a 371 of International PCT Application PCT/IB2010/056118, filed Dec. 29, 2010, which claims priority to U.S. Provisional Application Ser. Nos. 61/301,147 filed Feb. 3, 2010 and 61/311,172 filed Mar. 5, 2010, the contents of which are herein incorporated by reference in their entireties.

TECHNICAL FIELD

Disclosed are chalcogenide-containing precursors for use in the manufacture of semiconductor, photovoltaic, LCD-TFT, or flat panel type devices. Also disclosed are methods of synthesizing the chalcogenide-containing precursors and vapor deposition methods, preferably thermal ALD, using the chalcogenide-containing precursors to form chalcogenide-containing films.

BACKGROUND

Phase change memory (PCM) is a non-volatile memory commonly used in re-writable data storage media such as CDs and DVDs. The phenomenon relies on the ability of chalcogenide materials to exhibit unlimited and reversible phase change between their amorphous and crystalline phases, with each of these phases having very distinct optical and electrical properties. In electronic devices, each of these states is associated with one bit (0 or 1), which enables the storage of data.

The chalcogenide elements include sulfur, selenium, and tellurium. The chalcogenide materials used for PCM may take the form of an alloy and may include germanium and/or antimony. More particularly, $Ge_2Sb_2Te_5$ (GST) is one of the most studied chalcogenide materials.

Chalcogenide materials may be deposited using sputter techniques. However, sputter techniques may not allow deposition of films of sufficient quality upon introduction of further scaling to tens of nanometers of 3D circuit. Chemical vapor deposition (CVD) and atomic layer deposition (ALD) of chalcogenide materials may be needed to allow the manufacturing of giga-bit devices.

The synthesis of $(Me_3Si)_3SiTeSiMe_3$ and $HTeSi(SiMe_3)_3$ is reported, as well as the potential use of these compounds as CVD materials [P. J. Bonasia et al., New reagents for the synthesis of compounds containing metal-tellurium bonds: sterically hindered silyltellurolate derivatives and the X-ray crystal structures of $[(THF)_2LiTeSi(SiMe_3)_3]_2$ and $[(12\text{-crown-4})_2Li][TeSi(SiMe_3)_3]$, J. Am. Chem. Soc. (1992) 114, pp. 5209-5214].

Becker et al. report $TMS_3Si$—Te—Me and $TMS_3Si$—Te—Te—$SiTMS_3$. Synthese, Struktur and Reaktivitat des Lithium-[tris-trimethylsilyl]silyl]tellanids—DME, Z. Anorg Allg. Chem. (1992) 613, pp. 7-18.

Breunig reports the syntheses and properties of stibino or bismuthino selenides or tellurides, such as $MeSb(SeMe)_2$. Phosphorus and Sulfur, 1988, Vol. 38, pp. 97-102.

The problem the industry faces is finding precursors of germanium, antimony, tellurium, selenium, or sulfur which have enough similarities (volatility, decomposition temperature, reaction kinetics . . . ) to allow their use for deposition of chalcogenide-containing films, especially in thermal ALD mode. A plasma source is sometimes added to address this issue, but the radical species generated tend to damage the substrate and step coverage is usually insufficient.

SUMMARY

Disclosed are methods for the deposition of chalcogenide-containing films. The vapor of at least one chalcogenide-containing precursor is introduced into a reactor containing at least one substrate. The chalcogenide-containing precursor has the general formula:

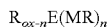

$$R_{ox-n}E(MR)_n$$

wherein:
each R is independently selected from H, C1-C6 alkyl (—$C_xH_{2x+1}$), C1-C6 alkoxy (—$OC_xH_{2x+1}$), C1-C6 perfluorocarbon (—$C_xF_{2x+1}$), alkylsilyl (—SiR'R'R'), alkylgermyl (—GeR'R'R'), alkylantimony (—SbR'R'), alkylsiloxy (—OSiR'R'R'), alkylgermoxy (—OGeR'R'R'), alkylstannoxy (—OSbR'R'), alkylamino (—NR'R'), alkylsilylamino (—NR'$_z$(SiR'R'R')$_{2-z}$), alkylgermylamino (—NR'$_z$(GeR'R'R')$_{2-z}$), alkylstannylamino (—NR'$_z$(SbR'R')$_{2-z}$), and aminoamido (—N(CR'R')$_z$NR'R'), each R' being independently selected among the above-mentioned R;
E is Si, Ge, Sb, or Bi;
M is tellurium, selenium, or sulfur;
ox is the oxidation state of E;
n is selected between 2 and 4, so that ox-n=0, 1, or 2;
x is an integer between 1 and 6; and
z is 0 or 1.

A vapor deposition process is used to deposit at least part of the at least one chalcogenide-containing precursor onto the at least one substrate to form a chalcogenide-containing film on at least one surface of the at least one substrate. The method may further include one or more of the following aspects:

- the at least one chalcogenide-containing precursor is $(MeTe)_2GeMe_2$;
- introducing one or more doping elements to the chalcogenide-containing film, wherein the one or more doping elements are selected from the group consisting of silicon, nitrogen, and oxygen;
- introducing a reactant into the reactor, wherein the reactant is selected from the group consisting of $H_2$, $NH_3$, amines, imines, hydrazines, $SiH_4$, $Si_2H_6$, $Si_3H_8$, $B_2H_6$, hydrogen-containing fluids, oxygen, ozone, moisture, alcohol (ROH, wherein R is a C1-C6 alkyl), and mixtures thereof;
- the vapor deposition process being chemical vapor deposition (CVD), atomic layer deposition (ALD), plasma enhanced chemical vapor deposition (PECVD), or plasma enhanced atomic layer deposition (PEALD);
- the reactor having a pressure ranging from about 1.33 Pa to about 133.3 kPa, preferably between about 25 Pa and about $10^3$ Pa;
- the reactor having a temperature ranging from about 10° C. to about 500° C., preferably between about 25° C. to about 400° C., more preferably about 50° C. to about 350° C.;
- the at least one substrate comprising a metal film or a metal nitride film;
- introducing into the reactor a second precursor comprising an element selected from the group consisting of germanium (Ge), antimony (Sb), bismuth (Bi), indium (In), and zinc (Zn);

the element of the second precursor reacting with M of at least part of the at least one chalcogenide-containing precursor to form the chalcogenide-containing film;

the second precursor being a germanium (Ge)-containing precursor and the chalcogenide-containing film being a GeM material;

the second precursor being an antimony (Sb)-containing precursor and the chalcogenide-containing film being a SbM material; and introducing into the reactor a third precursor, the third precursor being an antimony (Sb)-containing precursor, wherein the chalcogenide-containing film deposited is a GeSbM material.

Notation and Nomenclature

Certain abbreviations, symbols, and terms are used throughout the following description and claims and include:

The term "chalcogenide" refers to the chemical elements in group 16, and more particularly to sulfur, selenium, and tellurium. The term "alkyl group" refers to saturated functional groups containing exclusively carbon and hydrogen atoms. Further, the term "alkyl group" refers to linear, branched, or cyclic alkyl groups. Examples of linear alkyl groups include, without limitation, methyl groups, ethyl groups, propyl groups, butyl groups, etc. Examples of branched alkyl groups include, without limitation, t-butyl. Examples of cyclic alkyl groups include without limitation, cyclopropyl groups, cyclobutyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a chain propyl group; the abbreviation "iPr" refers to an isopropyl group; the abbreviation "Bu" refers to a butyl (n-butyl) group; the abbreviation "tBu" refers to a tert-butyl group; the abbreviation "sBu" refers to a sec-butyl group; the abbreviation "iBu" refers to an iso-butyl group; and the abbreviation "TMS" refers to a trimethylsilyl group.

The standard abbreviations of the elements from the periodic table of elements are used herein. It should be understood that elements may be referred to by these abbreviations (e.g., Te refers to tellurium, Ge refers to germanium, etc.).

BRIEF DESCRIPTION OF THE DRAWINGS

For a further understanding of the nature and objects of the present invention, reference should be made to the following detailed description, taken in conjunction with the accompanying drawings, wherein:

FIG. 1 illustrates structures of tellurium containing precursors used in accordance with embodiments of the disclosed methods;

FIG. 2 illustrates structures of sulfur containing precursors used in accordance with embodiments of the disclosed methods; and FIG. 3 is a graph illustrating a thermogravimetric analysis for the molecule $(MeTe)_2GeMe_2$.

DESCRIPTION OF PREFERRED EMBODIMENTS

Disclosed are precursors used in the deposition of chalcogenide-containing films in CVD and ALD mode, in a thermal, plasma, or any other source of energy mode, preferably in thermal ALD mode. The resulting chalcogenide-containing films as well as Si- or Ge-containing films may be used, for example, in phase change memory.

Also disclosed are synthesis routes of the disclosed precursors that allow high reaction yield, easy purification, and low cost of production, which are desired for the use of precursors in, for example, the semiconductor industry.

The disclosed chalcogenide-containing precursors have the general formula:

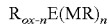

$$R_{ox-n}E(MR)_n$$

wherein each R is independently selected from H, C1-C6 alkyl (—$C_xH_{2x+1}$), C1-C6 alkoxy (—$OC_xH_{2x+1}$), C1-C6 perfluorocarbon (—$C_xF_{2x+1}$), alkylsilyl (—SiR'R'R'), alkylgermyl (—GeR'R'R'), alkylantimony (—SbR'R'), alkylsiloxy (—OSiR'R'R'), alkylgermoxy (—OGeR'R'R'), alkylstannoxy (—OSbR'R'), alkylamino (—NR'R'), alkylsilylamino (—NR'$_z$(SiR'R'R')$_{2-z}$), alkylgermylamino (—NR'$_z$(GeR'R'R')$_{2-z}$), alkylstannylamino (—NR'$_z$(SbR'R')$_{2-z}$), and aminoamido (—N(CR'R')$_z$NR'R'), each R' being independently selected from among the above-mentioned R; E is independently selected from Si, Ge, Sb, or Bi; M is tellurium, selenium, or sulfur; ox is the oxidation state of E; n is selected between 2 and 4 so that ox-n=0, 1, or 2; x is an integer between 1 and 6; and z is 0 or 1. The oxidation state ox is 3 when E is Sb or Bi, making the formula $R_{3-n}E(MR)_n$. The oxidation state ox is 4 when E is Si or Ge, making the formula $R_{4-n}E(MR)_n$. Preferably, R is Me, E is Ge, M is Te, and n is 2.

Exemplary tellurium-containing precursors include $Me_2Ge(TeMe)_2$, $Me_2Ge(TetBu)_2$, $tBu_2Ge(TetBu)_2$, $Me_2Ge(TeSiMe_3)_2$, $(Me_3Si)_2Ge(TeSiMe_3)_2$, $Me_2Si(TeMe)_2$, $Me_2Si(TetBu)_2$, $tBu_2Si(TetBu)_2$, $Me_2Si(TeSiMe_3)_2$, $(Me_3Si)_2Si(TeSiMe_3)_2$, $MeGe(TeMe)_3$, $MeGe(TetBu)_3$, $(SiMe_3)Ge(TeSiMe_3)_3$, $MeSi(TeMe)_3$, $MeSi(TetBu)_3$, and $(SiMe_3)Si(TeSiMe_3)$. Preferably, the precursor is $Me_2Ge(TeMe)_2$. The chemical structures of some of these precursors are shown in FIG. 1.

Exemplary selenium-containing precursors include $Me_2Ge(SeMe)_2$, $Me_2Ge(SetBu)_2$, $tBu_2Ge(SetBu)_2$, $Me_2Ge(SeSiMe_3)_2$, $(Me_3Si)_2Ge(SeSiMe_3)_2$, $Me_2Si(SeMe)_2$, $Me_2Si(SetBu)_2$, $tBu_2Si(SetBu)_2$, $Me_2Si(SeSiMe_3)_2$, $(Me_3Si)_2Si(SeSiMe_3)_2$, $MeGe(SeMe)_3$, $MeGe(SetBu)_3$, $(SiMe_3)Ge(SeSiMe_3)_3$, $MeSi(SeMe)_3$, $MeSi(SetBu)_3$, $(SiMe_3)Si(SeSiMe_3)$ Exemplary sulfur-containing precursors include $Me_2Ge(SMe)_2$, $Me_2Ge(StBu)_2$, $tBu_2Ge(StBu)_2$, $Me_2Ge(SSiMe_3)_2$, $(Me_3Si)_2Ge(SSiMe_3)_2$, $Me_2Si(SMe)_2$, $Me_2Si(StBu)_2$, $tBu_2Si(StBu)_2$, $Me_2Si(SSiMe_3)_2$, $(Me_3Si)_2Si(SSiMe_3)_2$, $MeGe(SMe)_3$, $MeGe(StBu)_3$, $(SiMe_3)Ge(SSiMe_3)_3$. $MeSi(SMe)_3$, $MeSi(StBu)_3$, $(SiMe_3)Si(SSiMe_3)$. The chemical structures of some of these precursors are shown in FIG. 2.

The disclosed chalcogenide-containing precursors may allow for the deposition of good quality films at high deposition rates due to the presence of more than one tellurium, selenium, or sulfur atom in the molecule and further due to the Te-E-Te, $E(Te)_3$, Se-E-Se, $E(Se)_3$, S-E-S, or $E(S)_3$ backbone originally present in the molecule.

Applicants believe that the use of linear molecules having a ratio Te/E higher than 1 has not been reported to date. The use of this new family of molecules is expected to allow deposition of films of good quality in CVD and ALD mode, preferably in thermal mode, with a higher deposition rate than when using the prior art $Te(ER_3)_2$ molecules.

The disclosed molecules may generally be synthesized using the following route (while the reaction of Te-containing molecules is provided below for the sake of the example, similar results would be obtained with the Te molecule substituted by Se or S). Additional details are provided in the Examples.

This reaction results in high yield without the generation of any other by-products. As a consequence, it is a significant improvement compared to Counter Example 2 (see Examples below).

Several $R_2GeCl_2$ complexes, such as $Me_2GeCl_2$, $Et_2GeCl_2$, $tBu_2GeCl_2$, are commercially available, allowing for a stable supply at competitive prices. Similarly, $RGeCl_3$ complexes, such as $MeGeCl_3$, $EtGeCl_3$, $(allyl)GeCl_3$, $tBuGeCl_3$, $nBuGeCl_3$, are easily available as well.

The disclosed synthesis route of the disclosed precursors leads to high reaction yield, easy purification, and low cost of production, which are desired advantages in any industry. Although the synthesis of such molecules has been reported, one reported yield was low (57% for $Me_2Ge(TeMe)_2$ based on Te, Drake et al., Inorg. Chem., 1980, Vol. 19, pp. 1879-1883) and the synthesis route difficult (involving multiple steps).

Also disclosed are methods for forming a chalcogenide-containing film on a substrate using a vapor deposition process. The method may be useful in the manufacture of semiconductor, photovoltaic, LCD-TFT, or flat panel type devices. The method includes: a) introducing into a reactor containing at least one substrate a vapor of at least one of the disclosed chalcogenide-containing precursors; and b) depositing at least part of the vapor onto the at least one substrate to form a chalcogenide-containing film on at least one surface of the substrate using a vapor deposition process.

At least part of the disclosed chalcogenide-containing precursors may be deposited to form chalcogenide-containing films using any vapor deposition methods known to those of skill in the art. Examples of suitable deposition methods include without limitation, conventional chemical vapor deposition (CVD), plasma enhanced chemical vapor deposition (PECVD), low pressure chemical vapor deposition (LPCVD), atomic layer deposition (ALD), pulsed chemical vapor deposition (P-CVD), plasma enhanced atomic layer deposition (PE-ALD), combinations thereof, and/or any other deposition technique known to those skilled in the art. Preferably, the deposition method is thermal CVD or ALD.

The chalcogenide-containing precursor is introduced into a reactor in vapor form. The precursor in vapor form may be produced by vaporizing a liquid precursor solution through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

The temperature and the pressure within the reactor and the temperature of the substrate are held at conditions suitable for deposition of at least part of the chalcogenide-containing precursor onto the substrate. The reactor or deposition chamber may be a heated vessel which has at least one or more substrates disposed within it. The reactor has an outlet which may be connected to a vacuum pump to allow by-products to be removed from the reactor, or to allow the pressure within the reactor to be modified or regulated. Examples of reactors include, without limitation, a parallel-plate type reactor, a cold-wall type reactor, a hot-wall type reactor, a single-wafer reactor, a multi-wafer reactor, or other types of deposition systems under conditions suitable to cause the precursors to react and form the layers.

The temperature in the reactor is normally maintained at a suitable temperature for the type of deposition process which is to be performed. In one alternative, the reactor may be maintained at a temperature greater than about 100° C. In another alternative, the temperature may be maintained between about 10° C. and about 500° C., preferably between about 25° C. to about 400° C., and preferably about 50° C. to about 350° C. The reactor may be maintained at a lower temperature when the substrates themselves are heated directly, or where another energy source (e.g. plasma or radio frequency source) is provided to aid in the deposition.

The pressure in the deposition chamber is maintained at a pressure between about 1.33 Pa to 133.3 kPa, and preferably between about 25 Pa and about $10^3$ Pa.

Generally, the reactor contains one or more substrates onto which the thin films will be deposited. For example, the reactor may contain from 1 to 200 silicon wafers having from 25.4 mm to 450 mm diameters. The substrates may be any suitable substrate used in semiconductor, photovoltaic, flat panel, or LCD-TFT device manufacturing. The substrates may contain one or more additional layers of materials, which may be present from a previous manufacturing step. Dielectric and conductive layers are examples of these. Within the scope of this application, all of the substrate and any layers deposited on the substrate are collectively included within the term substrate. Examples of suitable substrates include without limitation, metal substrates, metal nitride substrates, silicon substrates, silica substrates, silicon nitride substrates, silicon oxynitride substrates, tungsten substrates, and combinations thereof. Additionally, substrates comprising tungsten or noble metals (e.g. platinum, palladium, rhodium, or gold) may be used. Preferably, the substrate is a metal film or metal nitride film.

The substrate may be heated to a sufficient temperature to obtain the desired chalcogenide-containing film at a sufficient growth rate and with desired physical state and composition. A non-limiting exemplary temperature range to which the substrate may be heated includes from 150° C. to 600° C. Preferably, the temperature of the substrate remains less than or equal to 450° C.

Depending on the particular process parameters utilized, duration of the deposition process may vary. Generally, deposition may be allowed to continue as long as desired to produce a film with the necessary properties. Typical film thicknesses may vary from several hundred angstroms to several hundreds of microns, depending on the specific deposition process.

One or more doping elements may be added to the chalcogenide-containing film. Suitable doping elements are selected from the group consisting of silicon, nitrogen, and oxygen.

A reactant may be introduced into the reactor. The reactant is selected from the group consisting of $H_2$, $NH_3$, amines, imines, hydrazines, $SiH_4$, $Si_2H_6$, $Si_3H_8$, $B_2H_6$, hydrogen containing fluids, oxygen, ozone, moisture, alcohol (ROH, wherein R is a C1-C6 alkyl), and mixtures thereof.

The reactant may be a reducing gas. The reducing gas may be one of hydrogen, ammonia, silane, disilane, trisilane, hydrogen radicals, and mixtures thereof. When the mode of deposition is chemical vapor deposition, the precursor and the reducing gas may be introduced to the reactor substantially simultaneously. When the mode of deposition is atomic layer deposition, the precursor and the reducing gas may be introduced sequentially, and in some cases, there may be an inert gas purge introduced between introduction of the precursor and reducing gas.

Second and/or third precursors may also be provided and at least part of the second and/or third precursor may also be deposited on the substrate. Exemplary second and third precursors may comprise an element selected from the group consisting of germanium (Ge), antimony (Sb), bismuth (Bi), indium (In), and zinc (Zn). By providing germanium, tellurium, and antimony containing precursors, a chalcogenide glass type film may be formed on the substrate, for instance, GeTe, $Sb_2Te_3$, or $Ge_2Sb_2Te_5$.

Preferably, the metal of the second precursor reacts with the chalcogenide element M of the part of the chalcogenide-containing precursor deposited on the substrate. In one embodiment, the chalcogenide-containing precursor may be introduced into the reactor having conditions suitable to deposit at least part of the chalcogenide-containing precursor onto the substrate in an atomic layer deposition process. An inert gas purge may be used to remove any non-deposited chalcogenide-containing precursor from the reactor. The second precursor may then be introduced into the reactor and the metal of the second precursor may react directly with the M of the portion of chalcogenide-containing precursor deposited to form the metal-containing/chalcogenide-containing film, such as GeTe, SbSe, or BiS. In this embodiment, the two precursors may be sufficiently reactive to produce the metal-containing/chalcogenide-containing film without the use of a reactant species, such as $H_2$, $H_2O$ or $O_3/O_2$. However, even if the precursors are highly reactive, it may be beneficial to occasionally include a reactant species, such as $NH_3$ or $H_2$, in order to change the metal-containing/chalcogenide-containing film's properties (N incorporation, grain size, growth rate, incubation time, etc.).

The disclosed chalcogenide-containing precursor and any optional reactants or precursors may be introduced sequentially (as in ALD) or simultaneously (as in CVD) into the reactor. In some embodiments, the reactor is purged with an inert gas between the introduction of the precursor and the introduction of the reactant. In one embodiment, the reactant and the precursor may be mixed together to form a reactant/precursor mixture, and then introduced to the reactor in mixture form.

The disclosed chalcogenide-containing precursor and the optional reactant may be pulsed sequentially (ALD) or simultaneously (e.g. pulsed CVD) into the reactor. In either deposition method, each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each gas, whether introduced sequentially or simultaneously, may last for a time period ranging from about 0.01 seconds to about 10 seconds, alternatively from about 0.3 seconds to about 3 seconds, alternatively from about 0.5 seconds to about 2 seconds.

The chalcogenide-containing films or chalcogenide-containing layers resulting from the processes discussed above may include GeTe, GeSe, GeS, SbTe, SbSe, SbS, GeSbTe, GeSbSe, or GeSbS. Preferably, the chalcogenide-containing layers include $Ge_tTe_u$, $Ge_tSe_u$, $Ge_tS_u$, $Sb_tTe_u$, $Sb_tSe_u$, $Sb_tS_u$, $Ge_tSb_uTe_v$, $Ge_tSb_uSe_v$, $Ge_tSb_uS_v$, in which t, u, and v are numbers between 0 and 1. One of ordinary skill in the art will recognize that by judicial selection of the appropriate chalcogenide-containing precursor and reactant species, the desired film composition may be obtained.

EXAMPLES

The following non-limiting examples are provided to further illustrate embodiments of the invention. However, the examples are not intended to be all inclusive and are not intended to limit the scope of the inventions described herein.

For the syntheses described in Examples 1 to 5, all reactions and manipulations were conducted using Air-free Schlenck techniques and a glove box filled with argon. All reactions were performed using oven dried glassware, which was then evacuated and subsequently filled with dry argon. All reactions were carried out under slightly positive pressure of dry argon atmosphere and the reaction vessel was sealed by a Teflon valve and wrapped with aluminum foil during the reaction. Solvents were purified and degassed using standard procedure. Reagents were purchased from Aldrich or Gelest Inc. and used without purification. Filtration was carried out by using a stainless cannula or micropore wheel filter (Milipore).

Example 1

Synthesis of $(tBuTe)_2GeMe_2$

A pale yellow solution of tBuTeLi was prepared from Te powder (1.98 g, 15.5 mmol) in THF (20 mL) and tBuLi (1.55 M solution in n-pentane, 10 mL, 15.5 mmol) at 0° C. $Me_2GeCl_2$ (1.34 g, 0.750 mmol) was added to the solution at 0° C. After the mixture was stirred for 2 hours at 0° C. and 0.5 hours at room temperature, the insoluble materials were removed by filtration using a filtrate paper. The solvents of the filtrate were removed in vacuo, and n-pentane (5 mL) was added to the residue. Small amounts of the insoluble materials were removed by passage through a microporous membrane (25 microns pore size). The solvent was removed in vacuo, leaving $(tBuTe)_2GeMe_2$ (3.01 g, 0.64 mmol, 85% yield based on Ge) as a pale brown liquid.

Results from the spectroscopic analysis of the synthesized $(tBuTe)_2GeMe_2$ are as follows:

$^1$H NMR (600 MHz, C6D6): d=1.30 (s, 6H, 2Me), 1.75 (s, 18H, 2t-Bu);

$^{13}$C NMR (150 MHz, C6D6): d=7.48 (q, Me), 27.86 (s, tBu), 38.07 (q, tBu);

$^{125}$Te NMR (189 MHz, C6D6, $Me_2Te$): d=316.5

Example 2

Synthesis of $(MeTe)_2GeMe_2$

MeLi can be used instead of tBuLi in the same procedure as Example 1. $(MeTe)_2GeMe_2$ was isolated as orange liquid with an 80% yield (based on Ge).

Results from the spectroscopic analysis of the synthesized $(MeTe)_2GeMe_2$ are as follows:

$^1$H NMR (600 MHz, C6D6): d=0.95 (s, 6H, $Me_2Ge$), 1.49 (s, 6H, 2Me);

$^{13}$C NMR (150 MHz, C6D6): d=−24.08 (q, Me2Ge), 5.54 (q, 2MeTe);

$^{125}$Te NMR (189 MHz, C6D6, $Me_2Te$): d=−352.6

Counter Example 2

Synthesis of $(MeTe)_2GeMe_2$ [Drake et al., Inorg. Chem., 1980, Vol. 19, pp. 1879-1883]

1.18 mmol of $Me_2GeCl_2$ was reacted with an excess of $Me_3SiTeMe$ (3.09 mmol) and the disubstituted species $Me_2Ge(TeMe)_2$ (1.05 mmol, 89%, δ($CH_3$) 1.21, 1 67) was isolated as a nonvolatile orange oil. Id. at 1883, left column.

Me$_3$SiTeMe had been previously prepared with 64% yield, giving a total yield for the Me$_2$Ge(TeMe)$_2$ reaction of 57% (i.e., 89%×64%=57%). Id. at 1882, right column.

When the reactants (Me$_2$GeCl$_2$ and Me$_3$SiTeMe) were combined at a 1:1 ratio (Me$_3$SiTeMe not in excess), only weak resonances were observed at 1.21 and 1.67 ppm, attributable to Me$_2$Ge(TeMe) and strong additional lines were observed at 1.30 and 1.74 ppm (integrated intensities 2:1), attributable to the mixed chloro(methylelluro) species Me$_2$Ge(Cl)TeMe. Id. at 1883, left column.

Example 3

Synthesis of (tBuTe)$_2$SiMe$_2$

The same procedure as Example 1 was followed in Example 3, but Me$_2$SiCl$_2$ was used instead of Me$_2$GeCl$_2$. Results from the spectroscopic analysis of the synthesized (tBuTe)$_2$SiMe$_2$ are as follows:

$^1$H NMR (600 MHz, C6D6): d=0.77 (s, 6H, 2Me), 1.54 (s, 18H, 2t-Bu);
$^{13}$C NMR (150 MHz, C6D6): d=−1.15 (q, Me), 28.79 (s, tBu), 36.35 (q, tBu);
$^{125}$Te NMR (189 MHz, C6D6, Me$_2$Te): d=478.7

Example 4

Synthesis of (MeTe)$_2$SiMe$_2$

The same procedure as Example 2 was followed in Example 4, but Me$_2$SiCl$_2$ was used instead of Me$_2$GeCl$_2$. (MeTe)$_2$SiMe$_2$ was isolated as a liquid.
Results from the spectroscopic analysis of the synthesized (MeTe)$_2$SiMe$_2$ are as follows:

$^1$H NMR (600 MHz, C6D6): d=0.81 (s, 6H, Me2Si), 1.38 (s, 6H, 2Me);
$^{13}$C NMR (150 MHz, C6D6): d=−23.70 (q, Me$_2$Si), 4.58 (q, 2MeTe);
$^{125}$Te NMR (189 MHz, C6D6, Me$_2$Te): d=−427.7

Example 5

Synthesis of MeGe(TeMe)$_3$

The same procedure as Example 2 was followed in Example 5, but MeGeCl$_3$ was used instead of Me$_2$GeCl$_2$. The molar ratio of MeTeLi to MeGeCl$_3$ was 3:1.

Example 6

Thermal Characterization of Molecules of (MeTe)$_2$GeMe$_2$

The molecule (MeTe)$_2$GeMe$_2$ was synthesized as described in Example 2 and thermally characterized. All the thermo-gravimetric analyses (TGA) were performed in an inert atmosphere in order to avoid reaction of the molecules with air and moisture (same inert atmosphere encountered in the deposition process). The experiments were performed at atmospheric pressure. The results of the thermogravimetric analysis are shown in FIG. 3.

It was observed that this molecule can evaporate without leaving significant residue. This shows that decomposition of the molecule did not occur, even at temperatures as high as 225° C. The volatility of the molecule was also assessed from this TGA, and estimated to be about 133.3 Pa at 90° C. This vapor pressure is very close to that of GeCl$_2$-dioxane, a molecule used for GST deposition. Such a fit between molecules that need to be mixed together for binary or ternary deposition is desirable.

The TGA results for the molecules synthesized in Examples 1 and 3-5 were not as promising as those for (MeTe)$_2$GeMe$_2$.

Example 7

ALD Deposition of TeGe Containing Films Using (MeTe)$_2$GeMe$_2$ (Expected Result)

(MeTe)$_2$GeMe$_2$ was synthesized as described in Example 2. It is expected that Te-containing films may be formed in ALD mode using this molecule. This example describes one way, among others, to deposit such films.

The tellurium molecule may be placed in a canister. Vapors of (MeTe)$_2$GeMe$_2$ may be transported to the reactor by nitrogen bubbling while the canister is heated to provide sufficient vapor pressure. Vapors of a germanium molecule may be introduced into the reactor to react with the tellurium vapors at the surface of the wafer in an ALD scheme (in ALD mode, introduction of precursors' vapors are separated by sufficiently long purges of inert gas). GeCl$_2$-dioxane is believed to be a molecule of choice, but any type of germanium molecules can be selected. By using these two germanium and tellurium complexes, TeGe films may be obtained without introducing any other reactants. Analytical results show that a saturation mode typical to ALD mode may be obtained when extending the duration of the pulse(s) of the vapors of the tellurium molecule.

Example 8

ALD Deposition of GeSbTe Films Using (MeTe)$_2$GeMe$_2$ (Expected Results)

(MeTe)$_2$GeMe$_2$ was synthesized as described in Example 2. It is expected that Te-containing films may be formed in ALD mode using this molecule. The following example describes one way, among others, to deposit such films.

The tellurium molecule may be placed in a canister. Vapors of (MeTe)$_2$GeMe$_2$ may be transported to the reactor by nitrogen bubbling while the canister is heated to provide sufficient vapor pressure. Vapors of a germanium and an antimony molecule may be introduced into the reactor to react with the tellurium vapors in an ALD scheme (in ALD mode, introduction of precursors' vapors are separated by sufficiently long inert gas purges). GeCl$_2$-dioxane is believed to be a molecule of choice, as well as SbCl$_3$, but any type of germanium and antimony molecules can be selected. By using these three germanium, antimony, and tellurium complexes, GeSbTe films may be obtained without introducing any other reactants. Analytical results show that a saturation mode typical to ALD mode is obtained when extending duration of the pulse(s) of the vapors of the tellurium molecule.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method for the deposition of a chalcogenide-containing film, comprising the steps of:

a) introducing into a reactor containing at least one substrate a vapor of at least one chalcogenide-containing precursor selected from the group consisting of $Me_2Ge(TetBu)_2$, $tBu_2Ge(TetBu)_2$, $Me_2Ge(TeSiMe_3)_2$, $(Me_3Si)_2Ge(TeSiMe_3)_2$, $Me_2Si(TeMe)_2$, $Me_2Si(TetBu)_2$, $tBu_2Si(TetBu)_2$, $Me_2Si(TeSiMe_3)_2$, $(Me_3Si)_2Si(TeSiMe_3)_2$, $MeGe(TeMe)_3$, $MeGe(TetBu)_3$, $(SiMe_3)Ge(TeSiMe_3)_3$, $MeSi(TeMe)_3$, $MeSi(TetBu)_3$, and $(SiMe_3)Si(TeSiMe_3)$; and b) depositing at least part of the at least one chalcogenide-containing precursor onto the at least one substrate to form a chalcogenide-containing film on at least one surface of the at least one substrate using a vapor deposition process.

2. The method of claim 1, further comprising introducing one or more doping elements to the chalcogenide-containing film, wherein the one or more doping elements are selected from the group consisting of silicon, nitrogen, and oxygen.

3. The method of claim 1, further comprising introducing a reactant into the reactor, wherein the reactant is selected from the group consisting of $H_2$, $NH_3$, amines, imines, hydrazines, $SiH_4$, $Si_2H_6$, $Si_3H_8$, $B_2H_6$, hydrogen-containing fluids, oxygen, ozone, moisture, alcohol (ROH, wherein R is a C1-C6 alkyl), and mixtures thereof.

4. The method of claim 1, wherein the vapor deposition process is chemical vapor deposition (CVD), atomic layer deposition (ALD), plasma enhanced chemical vapor deposition (PECVD), or plasma enhanced atomic layer deposition (PEALD).

5. The method of claim 1, wherein the reactor has a pressure ranging from about 1.33 Pa to about 133.3 kPa.

6. The method of claim 1, wherein the reactor has a temperature ranging from about 10° C. to about 500° C.

7. The method of claim 1, wherein the at least one substrate comprises a metal film or a metal nitride film.

8. The method of claim 1, further comprising introducing into the reactor a second precursor comprising an element selected from the group consisting of germanium (Ge), antimony (Sb), bismuth (Bi), indium (In), and zinc (Zn).

9. The method according to claim 8, wherein the element of the second precursor reacts with Te of at least part of the at least one chalcogenide-containing precursor to form the chalcogenide-containing film.

10. The method of claim 9, wherein the second precursor is a germanium (Ge)-containing precursor and the chalcogenide-containing film is a GeTe material.

11. The method of claim 9, wherein the second precursor is an antimony (Sb)-containing precursor and the chalcogenide-containing film is a SbTe material.

12. The method of claim 10, further comprising introducing into the reactor a third precursor, the third precursor being an antimony (Sb)-containing precursor, wherein the chalcogenide-containing film deposited is a GeSbTe material.

\* \* \* \* \*